United States Patent [19]

Hills et al.

[11] Patent Number: 5,026,666
[45] Date of Patent: Jun. 25, 1991

[54] METHOD OF MAKING INTEGRATED CIRCUITS HAVING A PLANARIZED DIELECTRIC

[75] Inventors: Graham W. Hills, Los Gatos, Calif.; Robert D. Huttemann, Lower Macungie Township, Lehigh County; Kolawole R. Olasupo, Kutztown, both of Pa.

[73] Assignee: AT&T Bell Laboratories, Murray Hill, N.J.

[21] Appl. No.: 458,114

[22] Filed: Dec. 28, 1989

[51] Int. Cl.⁵ .................................. H01L 21/90
[52] U.S. Cl. ......................... 437/195; 437/41; 437/192; 437/228; 437/235; 156/643
[58] Field of Search ............... 437/235, 41, 192, 195; 148/DIG. 51, DIG. 81

[56] References Cited

U.S. PATENT DOCUMENTS

| | | | |
|---|---|---|---|
| 4,481,070 | 11/1984 | Thomas et al. | 156/643 |
| 4,601,781 | 7/1986 | Mercier et al. | 156/643 |
| 4,657,628 | 4/1987 | Holloway et al. | 437/235 |
| 4,708,767 | 11/1987 | Bril | 437/192 |
| 4,740,483 | 4/1988 | Tobin | 437/187 |
| 4,868,137 | 9/1989 | Kubota | 437/41 |
| 4,879,257 | 11/1989 | Patrick | 437/228 |
| 4,888,087 | 12/1989 | Moslehi et al. | 156/644 |
| 4,933,297 | 6/1990 | Lu | 437/41 |

OTHER PUBLICATIONS

S. M. Sze editor, *VLSI Technology*, McGraw-Hill Book Co., New York (1983), pp. 107-108.

*Primary Examiner*—Brian E. Hearn
*Assistant Examiner*—Laura M. Holtzman
*Attorney, Agent, or Firm*—James H. Fox

[57] ABSTRACT

An integrated circuit is made by a technique that provides a planar dielectric over gate, source, and drain regions without over-etching of the gate contact region. In the inventive process, the contact windows are etched in the conformal dielectric prior to the planarization step, so that the etch thickness is the same for the gate as for the source/drain windows. Then, a sacrificial planarizing polymer (e.g., a photoresist) is deposited to cover the conformal dielectric and fill the etched windows. Finally, a planarizing etch-back is performed, and the polymer is removed from the contact windows. A planarized dielectric is achieved without excessive etching of the gate windows.

12 Claims, 4 Drawing Sheets

METHOD OF MAKING INTEGRATED CIRCUITS HAVING A PLANARIZED DIELECTRIC

BACKGROUND OF THE INVENTION

1. Field of the Invention

The present invention relates to a technique for making an integrated circuit having a planarized dielectric, and the integrated circuit made thereby.

2. Description of the Prior Art

In the production of integrated circuits, it is necessary to form openings, referred to as windows (also referred to as contacts or vias), in one or more dielectric layers, in order to make electrical contact to underlying regions. A conductive layer is then deposited so as to cover the dielectric layer and fill the windows. The conductive layer is then lithographically patterned to form electrical conductors, referred to as "runners". As integrated circuit dimensions are reduced to below about 1 micrometer, it has become common practice to planarize the dielectric layer prior to etching the contact windows. This provides a flatter surface for the lithographic operation that patterns the dielectric and conductive layers. That is, a flatter surface reduces the depth-of-field requirements for the optical system used to expose the resist layer that defines the pattern in these layers. In addition, planarizing the first dielectric layer (i.e., the one adjacent the gate and source/drain regions) facilitates the patterning of subsequent dielectric and conductor layers in the so-called multilevel metal processes.

Various techniques have been developed to planarize a dielectric layer. One technique, referred to as "resist etch-back", involves depositing a photoresist on the surface to be planarized. Since the photoresist is a liquid, its top surface assumes a flat profile regardless of underlying irregularities. A plasma etch (e.g., reactive ion etch) of the hardened photoresist and the dielectric then causes the flat surface to be transferred into the underlying dielectric, when the etch rate of the photoresist is chosen to be similar to that of the dielectric. In another technique, a wafer polisher is used to planarize the surface of the dielectric. Note that in the prior art, these planarization techniques are practiced before the windows are etched, to provide for the above-noted lithographic advantage.

SUMMARY OF THE INVENTION

We have invented a technique for making an integrated circuit. A dielectric layer is formed so as to obtain approximately equal dielectric thicknesses over the gate, source, and drain contact regions. Windows are etched in the dielectric layer over the gate, source, and drain contact regions. After the window etching, a planarizing step is accomplished to improve the planarity of the top surface of the dielectric. One or more conductor levels may be deposited and patterned on the resulting structure.

DETAILED DESCRIPTION

The present detailed description refers to an improved method of making integrated circuits having a planarized dielectric layer with contact windows formed therein. An illustrative sequence of steps will show an embodiment of the invention for a MOS integrated circuit having gate, source, and drain regions contacted by means of a silicide layer. The present technique is especially useful when the gate electrode includes a titanium silicide top layer, since that has been found vulnerable to the over-etching problem inherent in the prior art technique. However, application to other types of electrode materials will be apparent.

Figure 1:
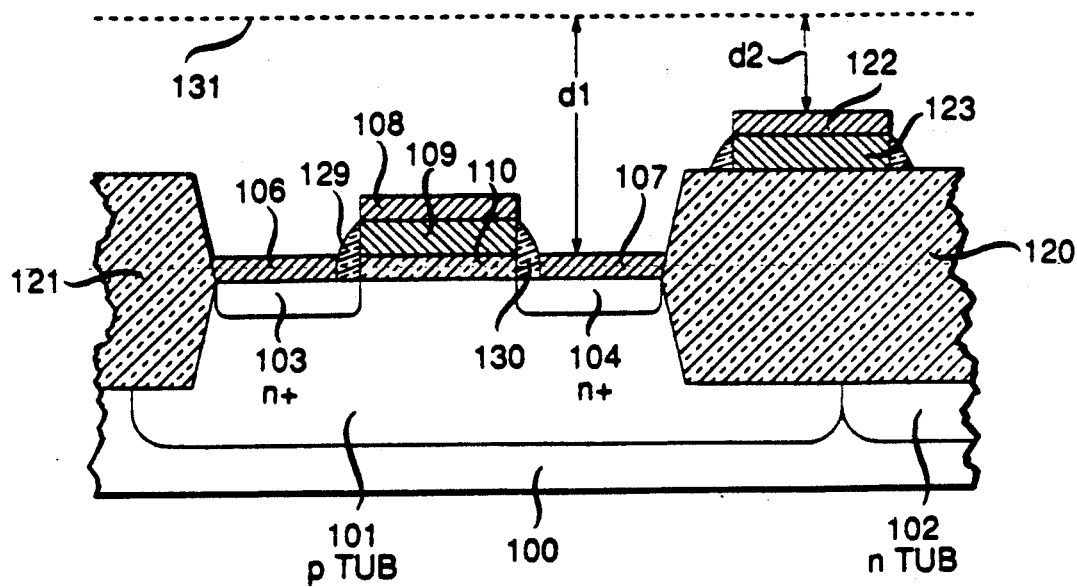
FIGS. 1-8 show an illustrative sequence of steps for practicing the present invention.

Referring to FIG. 1, a region of a MOS integrated circuit formed in a silicon substrate is illustrated. The substrate 100 may be a silicon wafer or an epitaxial layer formed on silicon or other materials. The transistors may be formed directly in the substrate, or in a doped tub region as shown. In the illustrative embodiment, a p-doped tub region 101 has formed therein a n-channel field effect transistor, which is isolated at the surface from adjacent transistors by field oxide regions 120 and 121. The transistor comprises n+ source region 103 and n+ drain region 104. The gate structure includes gate oxide 110 and doped polysilicon layer 109. The source, drain, and gate regions are covered by metal silicide regions 106, 107, and 108, respectively. The silicide regions may be formed simultaneously in the so-called "salicide" process, if desired. Also illustrated are optional gate sidewall oxide spacers 129-130, which allow for the formation of the "lightly doped drain" structure, if desired. It is of course possible to form a CMOS integrated circuit by providing p-channel devices in an optional n-tub region 102, if desired. The layers that form the gate structure also continue to run over the field oxide region to form a "gate runner", comprising regions 122 and 123, which are the same layers as 108 and 109, respectively. (Note that the gate runner 122-123 runs perpendicular to the plane of the figure, and comprises the gate structure of a transistor located behind the plane of the figure.) As thus described, the structure is conventional, and may be made by a variety of techniques well known in the art.

However, if the prior-art dielectric planarization techniques are utilized, then a planar dielectric surface 131 will be formed prior to opening the contact windows to the gate, source, and drain regions. We have found that this causes problems when etching the gate window, which is typically located over the runner 122-123 that is located on the field oxide region. Note that the distance $d_2$ is considerably less that $d_1$, since the gate runner is higher (from the substrate) than the source/drain regions. This implies that when the windows are etched in a planarized dielectric, the gate window will be cleared first, before the source/drain windows. Hence, to ensure adequate removal of overlying dielectric from the source/drain regions, the gate runner (e.g., silicide layer 122) may be exposed to the etchant for a time longer than is desirable. This may result in excessive removal of layer 122 or 123. The present invention provides a solution to this problem.

Figure 2:
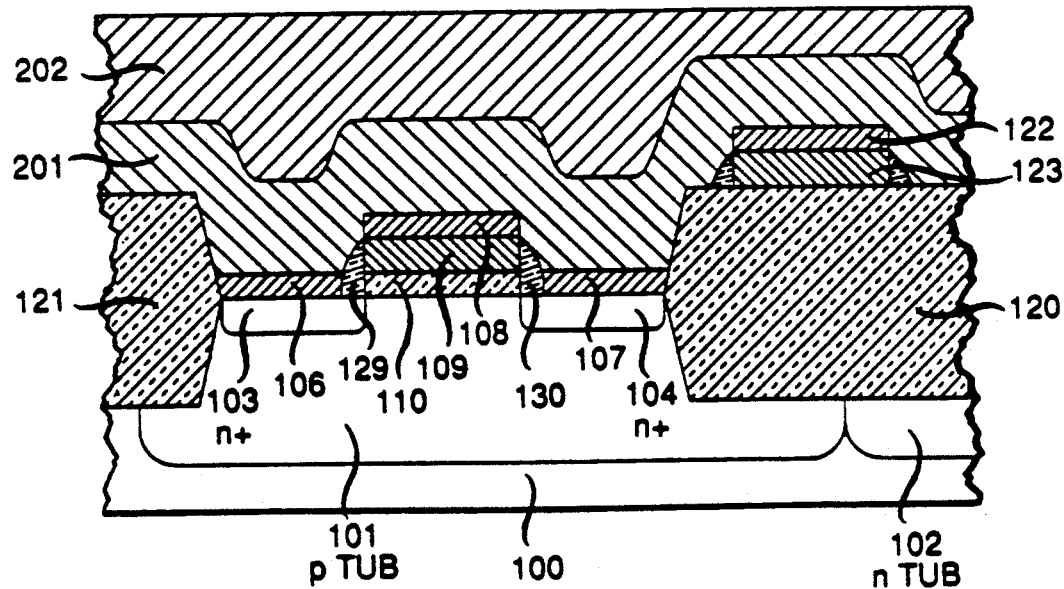

Referring to FIG. 2, a dielectric layer 201 is conformably deposited on the structure. This layer is typically silicon dioxide, and may be deposited by the decomposition by heating of tetraethoxysilane (TEOS) gas, which is known to give a highly conformal coating. The TEOS silicon dioxide layer is typically formed in two steps, with the first producing a layer of pure (i.e, undoped) silicon dioxide about 200 nanometers thick, and the second producing a 1.1 micrometer thick layer of silicon dioxide that includes about 2 weight percent each of phosphorus and boron. This structure provides for flowing of the resulting dielectric at elevated temperatures, while preventing unwanted dopant migration into the substrate. However, numerous other precursor gasses are known in the art for producing conformal dielectrics, and may be used to deposit the conformal dielectric layer 201 in either a doped or undoped state, in any desired thickness. A photoresist layer 202 is deposited on the dielectric, and lithographically exposed and developed. We have found that a satisfactory exposure with adequate depth of field is obtained with a Nikon "I line" ultraviolet stepper operating at a wavelength of 365 nanometers, when the step height d is 1.5 micrometers or less. The photoresist used was HPR 204.

Figure 3:
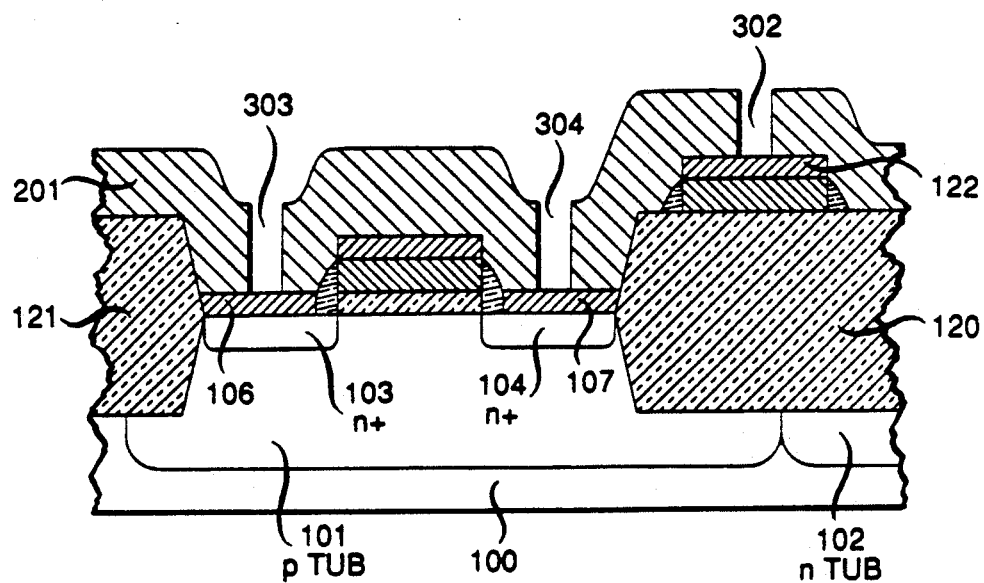

Referring to FIG. 3, the contact windows 302 . . . 304 are simultaneously etched in the conformal dielectric layer, and the patterning photoresist 202 is removed. The window 302 provides access to the gate, while windows 303 and 304 provide access to the source and drain, respectively. The window etching operation is typically accomplished by anisotropic reactive ion etching (RIE), with produces windows with vertical sidewalls. However, other anisotropic etching techniques, or even isotropic etching, (e.g., using wet etchants) are possible. For a total dielectric thickness of 1300 nanometers, a suitable RIE etch uses $CHF_3/Ar/CF_4$ at a pressure of about 80 mTorr, a magnetic field of about 50 Gauss, and a power level of 600 watts in an Applied Materials Precision 5000 etcher. Allowing the etch to proceed for 4 minutes provides for the required clearing of the oxide from the windows down to the silicide source, drain, and gate contact regions 106, 107 and 122, respectively. We have found that these conditions allow for sufficient over-etching to ensure that the oxide is completely cleared from the windows, but without excessive etching that would damage the silicide layers (especially the gate silicide). This result is achieved because the thickness of the conformal dielectric layer is essentially the same over the gate, source, and drain regions prior to etching.

Figure 4:
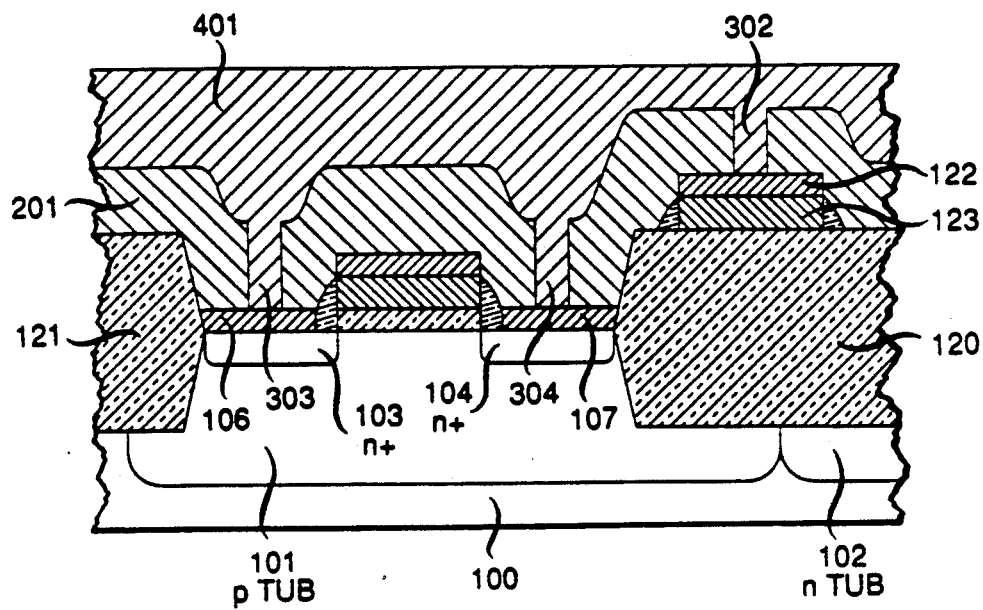

Referring to FIG. 4, a layer 401 of sacrificial planarizing material is deposited so as fill the windows. This material, typically an organic polymer (e.g., a photoresist) is applied in a liquid state so that its top surface assumes a flat profile. The material is chosen to have an etch rate similar to that of dielectric layer 201. In the illustrative case, HPR204 photoresist has been found to be satisfactory as a sacrificial planarizing material. Note that the planarizing photoresist as shown extends down into the windows 302 . . . 304 so as to contact the silicided source/drain regions in the substrate, and the silicided gate electrode as well. However, it is possible that the windows be partially filled with a conductive "plug" material. For example, tungsten may be selectively deposited in the windows prior to applying the planarizing photoresist.

Figure 5:
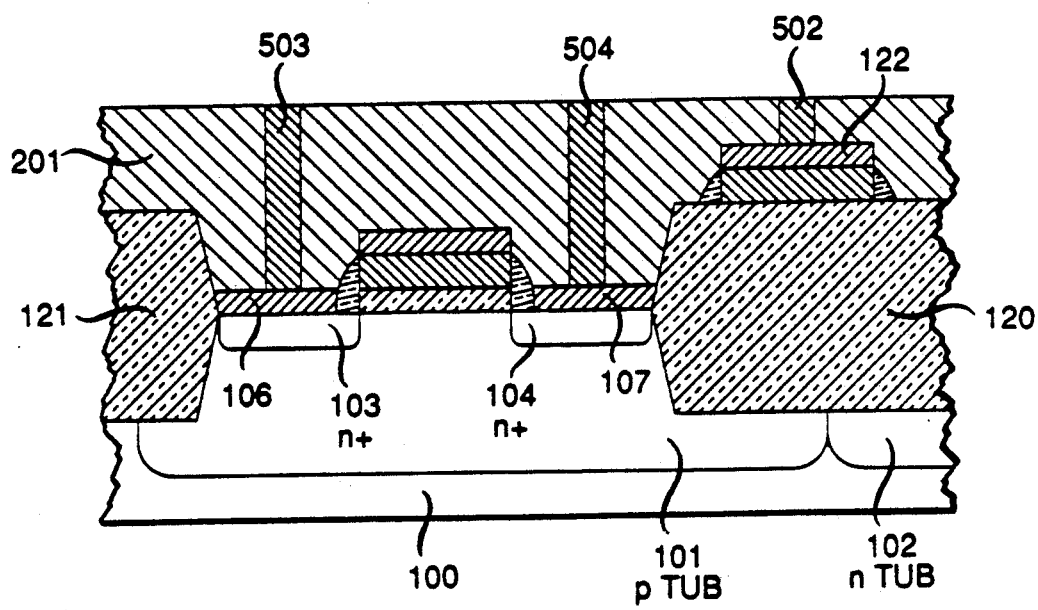

A planarizing etching operation is next accomplished, typically by anisotropic reactive ion etching (RIE). This operation transfers the flat surface of the planarizing photoresist into the underlying conformal dielectric layer 201. FIG. 5 shows the results of this operation. Note that the photoresist material still fills the windows, with the top of the photoresist plugs 502 . . . 504 in the windows being flush with the surface of the dielectric layer 201. We have found that a suitable planarizing etch with the above-noted silicon dioxide dielectric and photoresist material may be accomplished using $CHF_3$ and $O_2$ at a pressure of 60 mTorr in an Applied Materials 8110 hexode reactive ion etcher at power levels in the range of 1200 to 1400 watts. This planarizing etch may be accomplished in a multi-step process as follows:

(I) A fast removal of the top portion of the photoresist layer, without removal of the silicon dioxide, is obtained in a pure $O_2$ plasma.

(II) $CHF_3/O_2$ in a ratio of 60:35 removes about 400 nanometers of the photoresist and the silicon dioxide layer at equal rates, thereby planarizing the silicon dioxide dielectric.

(III) $CHF_3/O_2$ in a ratio of 2:1 provides for a reduction in oxygen concentration to compensate for the $O_2$ liberated by the etching of the $SiO_2$, thereby removing an additional 200nanometers of $SiO_2$.

(IV) $CHF_3/O_2$ in a ratio of 9:1 provides a greatly reduced oxygen concentration that allows a protective polymer to build up on the sides of the windows, thereby maintaining the diameter of the windows during the removal of the final 200 nanometers of the $SiO_2$.

Figure 6:
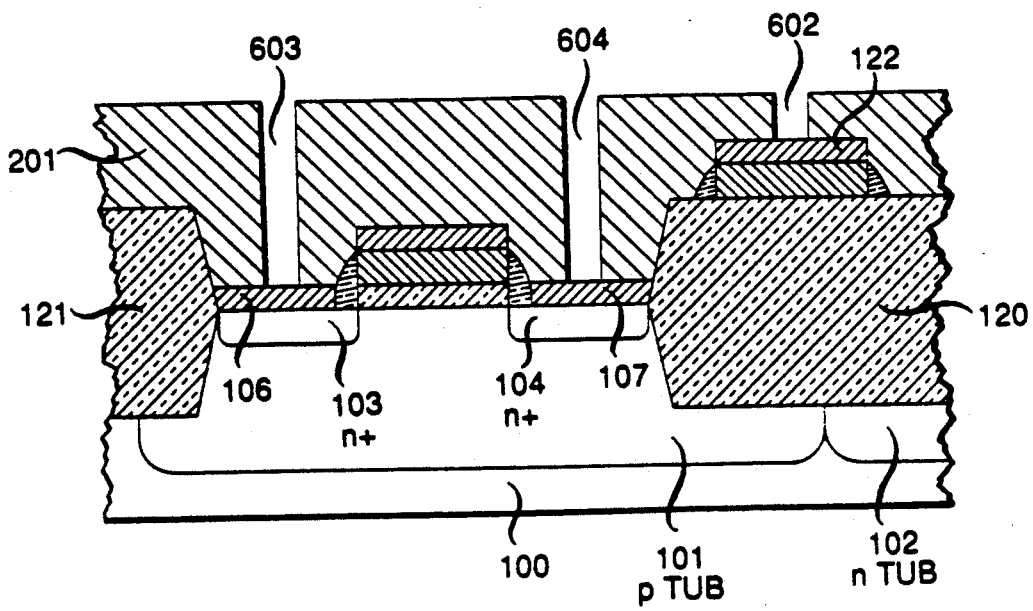

After the planarization is accomplished, the photoresist plugs in the windows are removed. This may be accomplished by an oxygen plasma to remove the photoresist plugs 502, 503, and 504. A solution of $H_2O_2/H_2SO_4$ removes any remaining photoresist residue. The result is a planarized dielectric layer having windows over the gate, source, and drain contact regions, as shown in FIG. 6.

Figure 7:
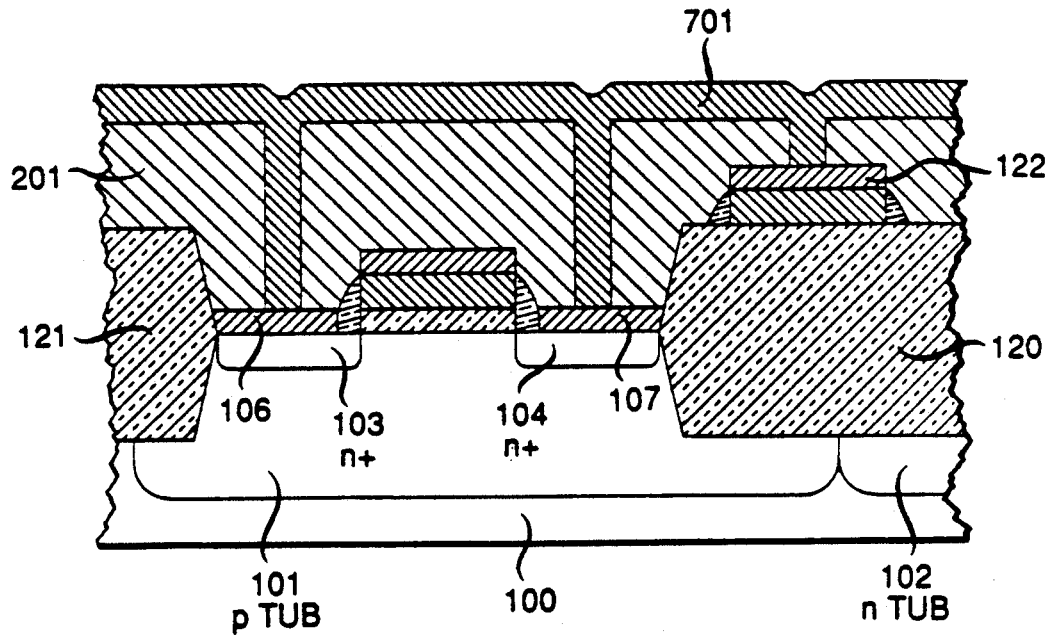
Figure 8:
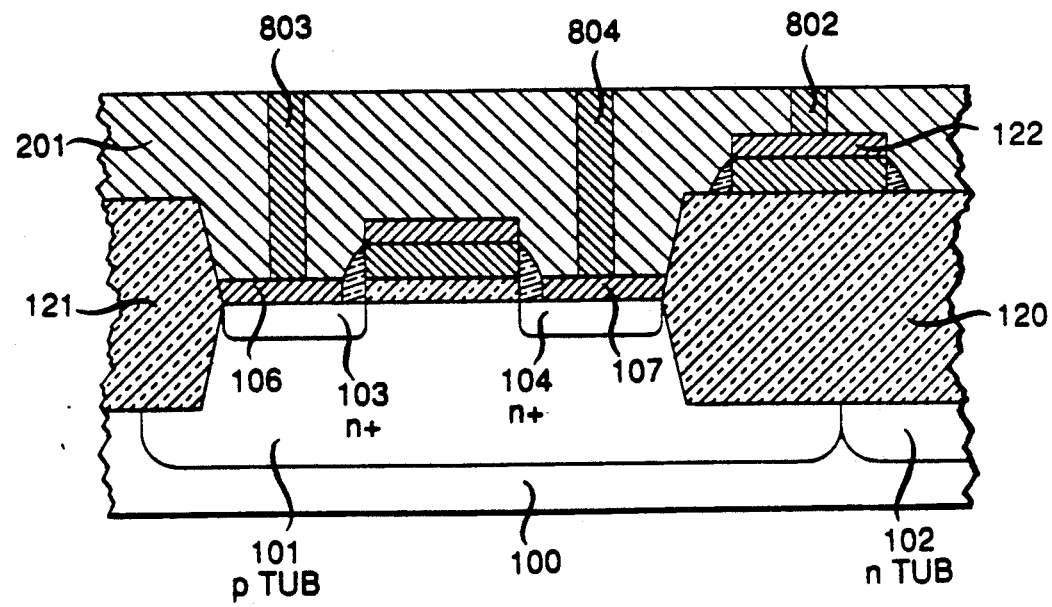

After thus forming the planarized dielectric layer, a conductive interconnect pattern may be formed in a variety of ways known in the art. In a presently preferred method, conductive plugs are formed in the windows prior to forming the conductive interconnect pattern over the planarized dielectric. For example, referring to FIG. 7, a layer 701 of tungsten is deposited over the planarized dielectric layer 201. The tungsten may be non-selectively deposited by chemical vapor deposition so as to both fill the contact windows, and also cover the dielectric (e.g., field oxide) surfaces. The tungsten may then be etched back by reactive ion etching, to produce the pluggd contact windows 802, 803, and 804 over the gate, source, and drain regions, respectively.

After forming the conductive plugs, a conductive interconnect pattern may be formed by depositing and patterning a conductive material by techniques known in the art. This conductive material may be doped polysilicon, a metal silicide, or a metal. In a typical case, aluminum is used as the conductor, with a layer of TiW or TiN serving as an adhesion layer to the underlying dielectric. However, other conductors, including refractory metals, are possible. Thereafter, additional dielectric and conductor layers may be deposited and patterned by techniques known in the art. Note that because the first dielectric layer 201 was planarized, these additional dielectric layers will be deposited on a relatively flat surface. Therefore, planarizing of these additonal dielectric layers may not be necessary, but may be accomplished if desired.

The illustrative embodiment has shown the planarizing accomplished with the use of a sacrificial planarizing polymer and a planarizing etch. However, other techniques are possible. For example, the above-noted mechanical polishing technique may be utilized in lieu of a photoresist/etch sequence. Furthermore, it is possible to first form a conductive plug in the window by known techniques, and then polish, which then both planarizes the dielectric and the plug material, so that the top of the plug is approximately flush with the surface of the dielectric. That is, the present invention recognizes that it is possible to perform a relatively difficult lithographic operation on the first dielectric layer while it is still in the conformal state (before planarization). Even though this places significant requirements on the depth-of-field of the lithographic technique used, it prevents the excessive etching of the gate window, while still allowing for subsequently-deposited layers to be formed on a relatively flat surface. Hence, the present invention provides for an advantageous sequence of steps not hitherto utilized by workers in the art.

Although the foregoing has illustrated the source and drain windows located over the source and drain doped regions, the windows may be offset somewhat. For example, a polysilicon or silicide pad may extend from the doped source/drain regions over the adjacent field oxide (an gate sidewall) regions. This allows the windows to be located at least partially over the field oxide, thereby easing lithographic alignment tolerances. This technique is further described in U.S. Pat. No. 4,844,776 coassigned herewith.

Furthermore, the above illustrative embodiment has shown the dielectric layer deposited in a conformal manner, so that the thickness is approximately the same on horizontal and vertical surfaces. However, directional deposition techniques may alternately be used. Directional deposition produces an approximately equal thickness only over the horizontal surfaces (e.g., gate, source, and drain contact regions), and a much smaller thickness on vertical surfaces (e.g., the gate sidewall). For example, the recently developed electron cyclotron resonance (ECR) technique may be used for depositing the dielectric layer that is planarized by the invention technique. As using herein, thicknesses are considered to be approximately equal on horizontal surfaces if they differ by less than about 25 percent.

If desired, the same lithographic technique used to define the contact windows may be used to define subsequently-deposited layers. Alternatively, different lithographic techniques may be used. For example, a lithographic technique having a relatively large depth-of-field may be used to define the contact windows, with subsequent layers being defined using lithographic techniques that have a smaller depth of field. Such a combination includes, for example, an X-ray or electron beam technique for the contact windows, and UV techniques for the subsequent layers. Still other combinations and variations are possible.

We claim:

1. A method of making an integrated circuit in a semiconductor body by steps comprising:

forming a gate region that includes a gate dielectric overlying said body, and a gate conductor overlying said gate dielectric; and forming source and drain doped regions in said semiconductor body, characterized by the further steps of:

forming a dielectric layer so as to have an approximately equal thickness on gate, source and drain contact regions;

etching contact windows into said dielectric layer;

planarizing said dielectric layer after said etching; and forming electrically conductive material in said windows after said planarizing so as to form electrical contacts to said gate, source, and drain contact regions through said windows.

2. The method of claim 1 wherein said gate conductor includes a metal silicide.

3. The method of claim 2 wherein said source and drain doped regions have a metal silicide layer formed thereon.

4. The method of claim 2 wherein said metal silicide is titanium silicide.

5. The method of claim 1 wherein said planarizing is accomplished by steps comprising depositing a sacrificial planarizing material so as t cover said dielectric layer and at least partially fill said windows, thereby obtaining a relatively flat surface of said material, and etching said sacrificial planarizing material so as to transfer its relatively flat surface into said dielectric layer.

6. The method of claim 1 wherein said planarizing is accomplished by polishing said dielectric layer.

7. The method of claim 1 wherein said forming electrically conductive material includes the step of forming conductive plugs in said windows.

8. The method of claim 7 further comprising the step of forming a conductive interconnect pattern that contacts said plugs in said windows.

9. The method of claim 1 wherein said dielectric layer is silicon dioxide.

10. The method of claim 1 wherein said dielectric layer is formed by conformal deposition.

11. The method of claim 10 wherein said dielectric layer is silicon dioxide deposited by decomposition of tetraethoxysilane (TEOS) gas.

12. The method of claim 1 wherein said dielectric layer is formed by directional deposition so that the thickness of said dielectric layer is greater on horizontal surfaces than on vertical surfaces of said integrated circuit.

* * * * *